United States Patent
Alexeyev

(10) Patent No.: US 10,739,424 B2
(45) Date of Patent: Aug. 11, 2020

(54) OUTPUT IMPEDANCE CALIBRATION OF INTEGRATED SWITCHED-MODE POWER AMPLIFIERS

(71) Applicant: Alexander Alexeyev, Beverly, MA (US)

(72) Inventor: Alexander Alexeyev, Beverly, MA (US)

(73) Assignee: WAVEGUIDE CORPORATION, Cambridge, MA (US)

( * ) Notice: Subject to any disclaimer, the term of this patent is extended or adjusted under 35 U.S.C. 154(b) by 0 days.

(21) Appl. No.: 15/935,830

(22) Filed: Mar. 26, 2018

(65) Prior Publication Data

US 2018/0275228 A1    Sep. 27, 2018

Related U.S. Application Data

(60) Provisional application No. 62/477,009, filed on Mar. 27, 2017.

(51) Int. Cl.
*G01R 33/36* (2006.01)
*G01R 33/58* (2006.01)
*G01R 33/30* (2006.01)

(52) U.S. Cl.
CPC ....... *G01R 33/3614* (2013.01); *G01R 33/302* (2013.01); *G01R 33/3607* (2013.01);
(Continued)

(58) Field of Classification Search
None
See application file for complete search history.

(56) References Cited

U.S. PATENT DOCUMENTS

| | | | | |
|---|---|---|---|---|
| 6,087,853 A | * | 7/2000 | Huber | H03K 19/0005 326/83 |
| 6,788,745 B1 | * | 9/2004 | Lim | H04L 25/0298 375/297 |

(Continued)

FOREIGN PATENT DOCUMENTS

| | | |
|---|---|---|
| WO | 2006107815 | 10/2006 |
| WO | 2008105592 | 9/2008 |

OTHER PUBLICATIONS

International Search Report and Written Opinion, International Application No. PCT/US2018/024333, dated Jul. 26, 2018, 15 pages.

*Primary Examiner* — Nasima Monsur
(74) *Attorney, Agent, or Firm* — Morgan, Lewis & Bockius LLP

(57) ABSTRACT

Systems and methods for reducing variability in the output impedance of an integrated switch-mode power amplifier (PA) split the output impedance between passive resistor, which may be on-chip, and a MOSFET switch of the amplifier. The PA may have a single-ended configuration or a differential configuration having two single-ended structures operating with opposite phases. In one implementation, the size of the MOSFET switch is larger than that of the MOSFET switch implemented in a conventional PA, but the size is still acceptable to operate the PA at a desired frequency. In addition, a calibration approach may be utilized to ensure that the MOSFET switch has a controlled and calibrated ON resistance, thereby providing stable output power levels of the PA and ensuring consistency and repeatability in NMR measurements.

17 Claims, 6 Drawing Sheets

(52) U.S. Cl.
CPC ..... *G01R 33/3621* (2013.01); *G01R 33/3628* (2013.01); *G01R 33/583* (2013.01)

(56) References Cited

U.S. PATENT DOCUMENTS

| | | | |
|---|---|---|---|
| 2002/0044018 A1* | 4/2002 | Dupuis | H01L 23/645 330/254 |
| 2002/0079971 A1* | 6/2002 | Vathulya | H03F 1/223 330/311 |
| 2006/0214688 A1 | 9/2006 | Pan et al. | |
| 2009/0237157 A1* | 9/2009 | Sander | H03C 5/00 330/127 |
| 2011/0057654 A1* | 3/2011 | Sun | G01R 33/3628 324/318 |
| 2014/0176135 A1 | 6/2014 | Griswold et al. | |

\* cited by examiner

OUTPUT IMPEDANCE CALIBRATION OF INTEGRATED SWITCHED-MODE POWER AMPLIFIERS

CROSS-REFERENCE TO RELATED APPLICATION

This application claims priority to and the benefit of, and incorporates herein by reference in its entirety, U.S. Provisional Patent Application No. 62/477,009, filed on Mar. 27, 2017.

FIELD OF THE INVENTION

The field of the invention relates, generally, to nuclear magnetic resonance (NMR) equipment, and in particular to managing output impedance in such equipment.

BACKGROUND

Nuclear magnetic resonance (NMR) is a well-known analytic technique that has been used in a number of fields, such as spectroscopy, bio-sensing and medical imaging. In general, an NMR device includes transceiver circuits to transmit signals to a test sample and receive echo signals therefrom. For example, with reference to FIG. 1, the basic components a conventional NMR system 100 include an NMR coil 102 surrounding a sample 104 being analyzed, a magnet 106 for generating a static magnetic field $B_0$ across the sample 104 and the coil 102, a duplexer 108 coupled to the NMR coil 102, and a controller 110 for controlling operation of the various components. Typically, the duplexer 108 includes a transmitter (Tx) portion for delivering RF signals to the NMR coil 102 and a receiver (Rx) portion for receiving echo signals from the sample 104 vis the NMR coil 102.

NMR coil 102 and transceiver 108 are commonly known as an "NMR probe," which operates with large electromagnets or superconducting permanent magnets in conventional NMR systems. The NMR probe is typically included in an environment having a 50Ω impedance because of a long interconnection required between the probe and NMR instrument.

The RF signals delivered by the duplexer 108 originate with an RF frequency source 115 and a pulse sequence generator 117. A modulator circuit 120 modulates the RF signal from the RF frequency source 115 in accordance with the pulse sequence supplied by the pulse sequence generator 117. The modulated RF signal is amplified by a power amplifier 122.

During NMR measurements, the modulated RF signal having a Larmor frequency $\omega_0$ is delivered to the coil 102 via the duplexer 108; the coil 102 generates an RF magnetic field $B_1$ (which is typically orthogonal to the static magnetic field $B_0$) that resonantly excites nuclei spins within the sample 104. After a time duration, $\Delta t$, the RF excitation signal is stopped and the controller 110 causes the duplexer 108 to receive the echo signals from the sample 104. Upon stopping the RF excitation, the nuclear spins within the sample 104 precess around the $B_0$-axis at the Larmor frequency $\omega_0$. The nuclear spins slowly lose phase coherence via spin-spin interactions, which manifest themselves in a macroscopic average as an exponential relaxation or damping signal in the precession of the net magnetic moment. This NMR signal relaxation can be detected by the coil 102. Because the spin-spin interactions are peculiar to the material of the sample 104 being tested, the characteristic time, commonly referred to as $T_2$, of the relaxation signal is material specific.

The duplexer 108 directs the received echo signals, representing the signal output of the NMR probe, to an amplification block including a pre-amplifier (e.g., a low-noise amplifier 125) and a programmable gain amplifier 127. The signal is ultimately converted to digital form by an analog-to-digital converter (ADC) 130 for processing. But the frequency of the "raw" NMR signal received by the pre-amplifier 125 is too high for the ADC 130, and is therefore "down-converted" through comparison with the signal supplied by the RF frequency source 115. A mixer 135 combines the amplified NMR signal, which oscillates at the Larmor frequency, with the reference signal from the RF frequency source to generate a new signal that oscillates at a lower "relative Larmor frequency." Following filtering by a low-pass filter 137, the signal varies slowly enough to be handled by the ADC 130 but nonetheless retains the essential frequency characteristics of the received echo signals.

Thus, by measuring the Larmor frequency $\omega_0$ described above (e.g., for spectroscopy) and characteristic time $T_2$ (e.g., for relaxometry), NMR techniques can be used as an analytic tool in a number of fields, including but not limited to chemical composition analysis, medical imaging, and bio-sensing.

Significant efforts have been devoted to miniaturizing traditional NMR systems. For example, the entire NMR electronics, including the power amplifier (PA) 122, may be integrated on a single semiconductor device. The numerous advantages of miniaturization include low cost, portability, and the fact that a micro-coil tightly surrounding a small sample increases the signal quality. In addition, reducing the size of the magnet 106 allows use of a much smaller power to excite (or polarize) the sample 104 than in a conventional system.

FIG. 2 depicts a traditional class-D PA 200 implemented in a miniaturized NMR system; the input signal Vs to the PA 200 is typically a square-wave signal having low and high amplitudes between the ground ($V_{SSPA}$) and the PA source voltage ($V_{DDPA}$). The input signal is used to close and open switches 202, 204 in an alternating fashion for connecting an output load 206 to either $V_{DDPA}$ or $V_{SSPA}$. The power transferred to the load 206 depends on the output impedance of the amplifier 200, the input signal amplitude Vs, and the load impedance $R_L$. In a single-ended PA as depicted in FIG. 2, the delivered power can be represented as:

$$P_L = \frac{1}{2}\frac{|V_S|^2 R_L}{(R_{Out}+R_L)^2}.$$

The traditional class-D PA typically delivers a power ranging from watts to kilowatts, but it has a somewhat limited bandwidth (usually much less than 1 MHz). In addition, because the output impedance of the traditional class-D amplifier is fixed, the available power setting is also fixed for the fixed power-supply voltage $V_{DDPA}$. In other words, the power and output impedance of the amplifier are not separable. Because of this constraint, it is difficult to adjust the power available from the amplifier in order to optimize the excitation parameters (such as magnetization flipping angles and NMR excitation pulse spacing) of an NMR measurement.

Recent developments in class-D amplifier technology have been exploited to generate excitation signals suitable for NMR measurements, particularly in low-field time-domain NMR relaxometry. A number of difficulties, however, exist. For example, in order to make NMR measurements, the PA requires a wide bandwidth (e.g., between 10 MHz and 60 MHz). In addition, impedance matching is important (but harder to achieve in NMR applications compared to classic audio or power applications) for optimizing the power delivery (as shown by the equation above), and PA power levels have to be maintained with accuracy and consistency for repeatable NMR measurements.

Various strategies to address these difficulties have been proposed, generally involving the use of discrete components for the PA and assuming the ON resistance of the switches 202, 204 to be negligible. This allows the output impedance of the PA to be set by an external precision resistor. When integrating the PA and other NMR electronics on a single semiconductor device—resulting in an integrated "switch-mode" power amplifier—the switch devices 202, 204 are typically implemented using MOSFETs whose gates are controlled by an input RF signal having a square wave form with an amplitude of $V_{DDPA}$ $V_{SSPA}$.

In a typical NMR application, the PA drives a 50Ω load impedance. This means that for the case of a differential class-D PA, each PA driver has an output impedance of 25Ω for an optimal, reflection-free power delivery to the load. The ON resistance of the MOS device, however, varies with manufacturing processes, supply voltage and temperature. In addition, the highly nonlinear behavior for large voltages across the device makes it extremely challenging to implement a basic MOSFET switch having a constant ON resistance of 25Ω.

Accordingly, there is a need for an approach that reduces the variability of the output impedance of an integrated switch-mode power amplifier in order to maintain consistent power levels repeatably during NMR measurements.

SUMMARY

Embodiments of the present invention provide an approach for reducing variability in the output impedance of an integrated switch-mode power amplifier by splitting the output impedance between passive resistor, which may be on-chip, and a MOSFET switch of the amplifier. The PA may have a single-ended configuration or a differential configuration having two single-ended structures operating with opposite phases. In one implementation, the size of the MOSFET switch is larger than that of the MOSFET switch implemented in a conventional PA, but the size is still acceptable to operate the PA at a desired frequency. In addition, a calibration approach may be utilized to ensure that the MOSFET switch has a controlled and calibrated ON resistance, thereby providing stable output power levels of the PA and ensuring consistency and repeatability in NMR measurements.

In various embodiments, a replica circuit of a class-D PA-driver sensor is utilized to monitor the output impedance of the matched replica switch devices; a software (and/or hardware) implemented state-machine algorithm may then be utilized to automatically adjust the output impedance of the PA to achieve a target value set by a pair of externally matched precision resistors. Implementation of the resistor on-chip may advantageously eliminate the need for an external resistor component and, at the same time, reduce voltage swings across the MOSFET switch device, thereby increasing the linearity thereof.

Accordingly, in a first aspect, the invention pertains to circuitry for reducing variability of an output impedance of an integrated switch-mode PA. In various embodiments, the circuitry comprises a PA driver; a pre-driver for facilitating activation and deactivation of the PA driver; and a passive resistor coupled to the PA driver so as to split the output impedance between the PA driver and the passive resistor. The PA driver may comprise or consist of a PMOS device and an NMOS device. Typically, the on-chip passive resistor has an impedance that substantially does not depend on temperature or voltage.

In various embodiments, the circuitry further comprises a calibration circuit for calibrating an ON resistance of the PA driver so as to provide stable output power levels. The calibration circuit may comprise a replica circuit of the PA driver and a load resistor, and may further comprise an on-chip voltage divider for generating a reference voltage. In some embodiments, the calibration circuit further comprises a comparator for comparing the reference voltage with an output voltage of the replica circuit and the load resistor. The passive resistor may be on-chip or off-chip.

In another aspect, the invention pertains to an NMR apparatus comprising an NMR coil configured to enclose a sample, an integrated switch-mode PA coupled to the NMR coil, and circuitry for reducing variability of an output impedance of the PA. In various embodiments, the circuitry comprises (i) a PA driver, (ii) a pre-driver for facilitating activation and deactivation of the PA driver; and (iii) an on-chip passive resistor coupled to the PA driver for splitting the output impedance between the PA driver and the passive resistor. The circuitry may include one or more of the features described above.

In another aspect, the invention relates to a method of reducing variability of an output impedance of an integrated switch-mode PA. In various embodiments, the method comprises providing a PA driver having at least one MOS device; providing a pre-driver for facilitating activation and deactivation of the PA driver; and adjusting the number of stripes of the MOS device(s) so to provide a desired impedance.

In general, as used herein, the term "substantially" means±10%, and in some embodiments, ±5%. In addition, reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 1:
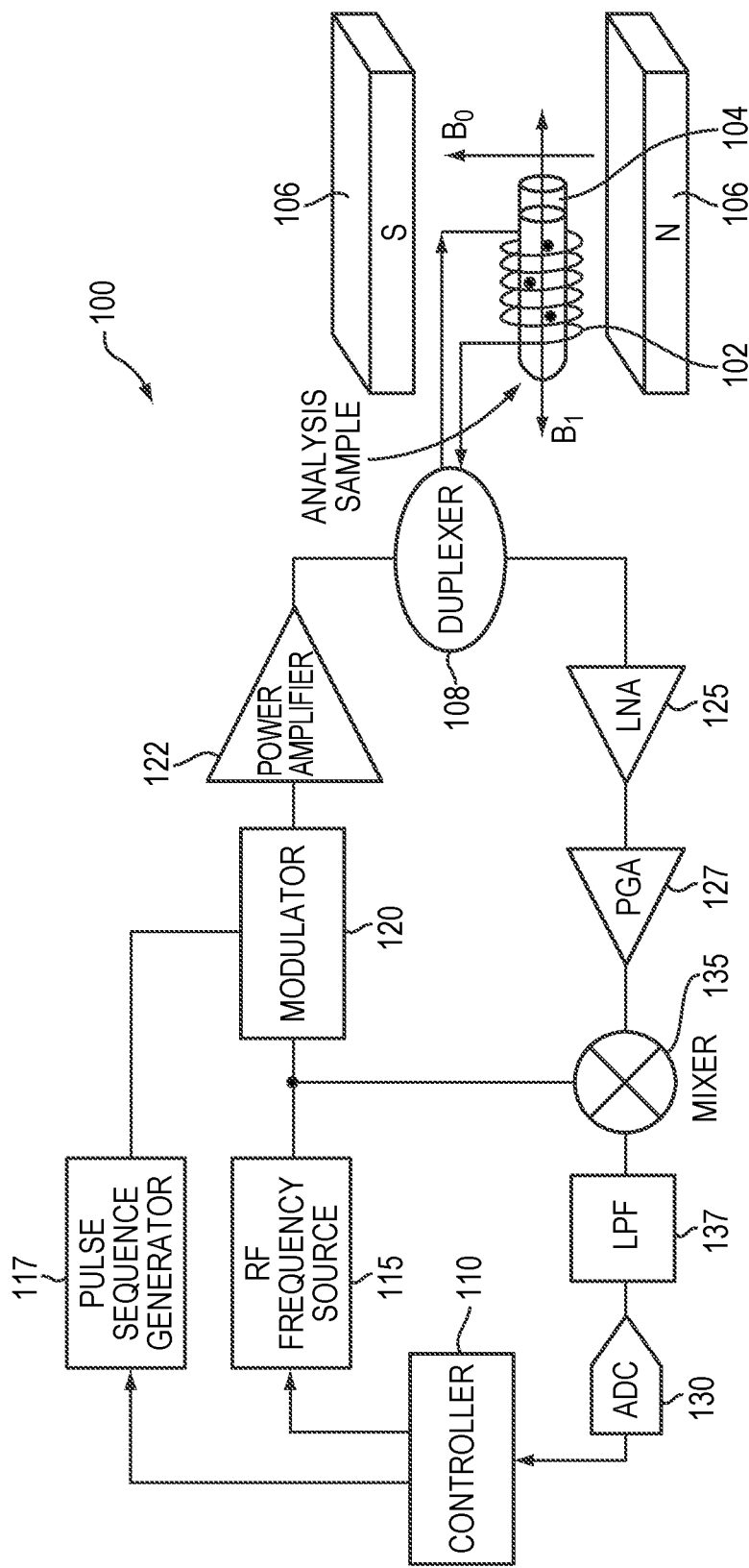
FIG. 1 schematically illustrates a conventional NMR device.
Figure 2:
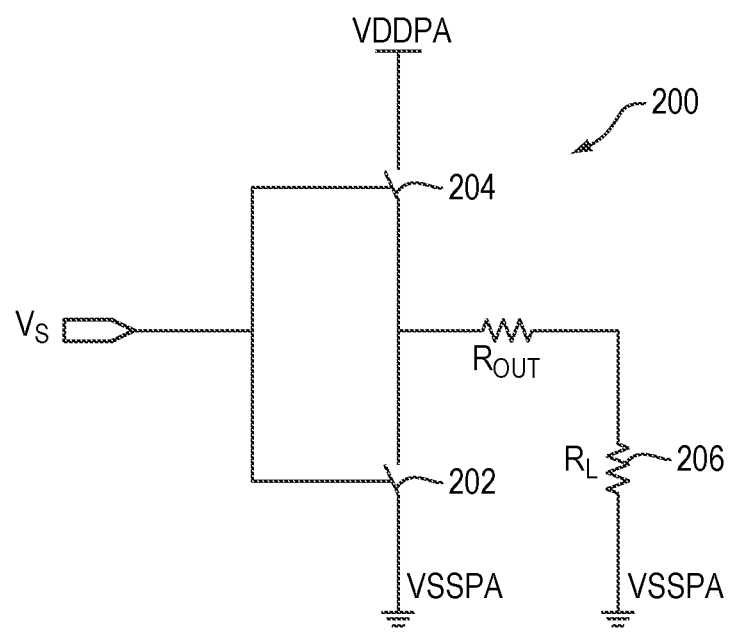
FIG. 2 schematically illustrates a conventional class-D power amplifier.
Figure 3A:
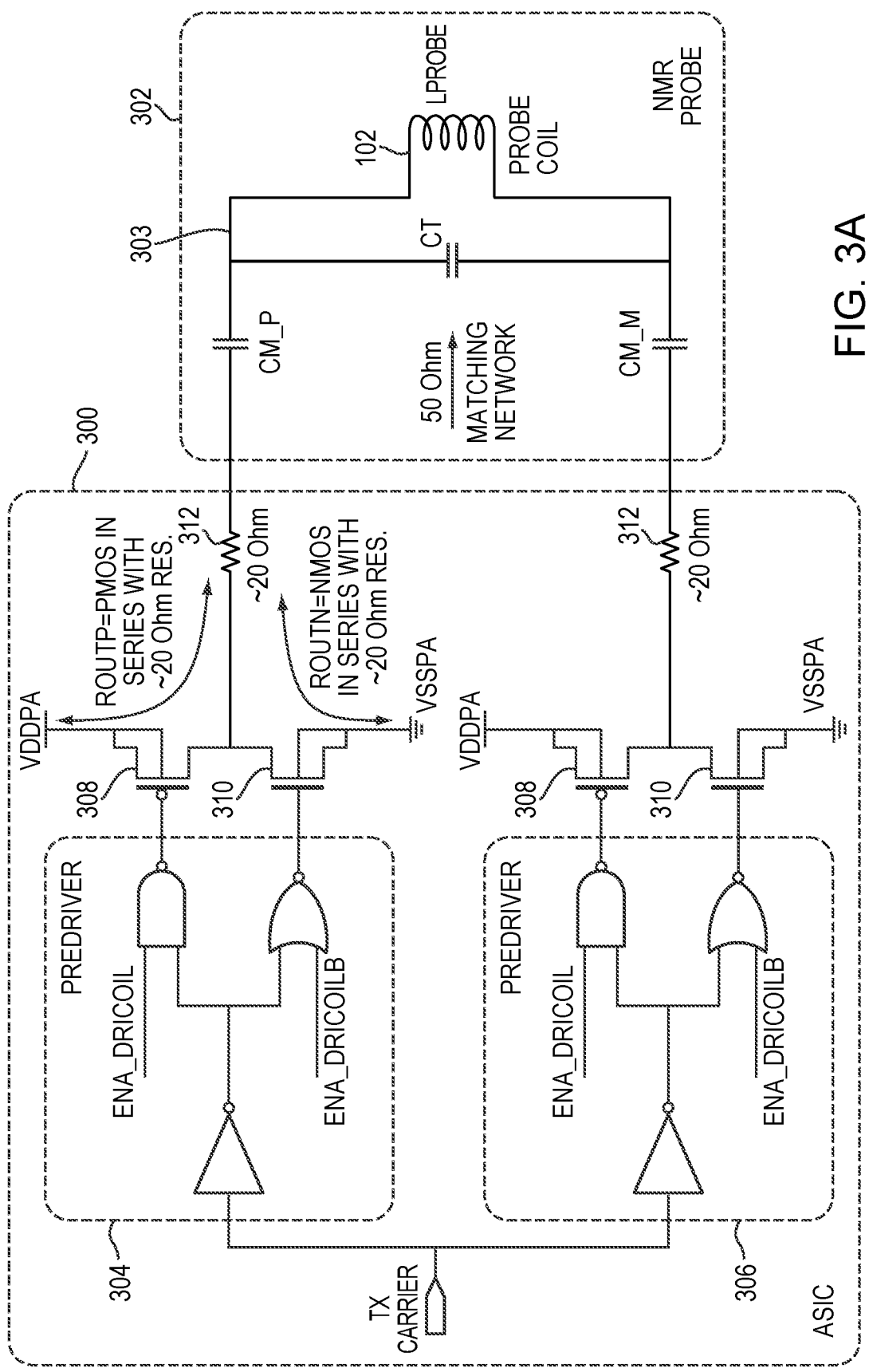
FIG. 3A schematically illustrates a circuit comprising an exemplary class-D PA interface coupled to an NMR probe in accordance with various embodiments of the present invention.

Refer first to FIG. 3A, which depicts an exemplary differential class-D PA interface 300 coupled to an NMR probe 302 in accordance with various embodiments of the present invention. The PA is implemented as a part of a CMOS (Complementary Metal Oxide Semiconductor) application-specific integrated circuit (ASIC) chip. The NMR probe 302 includes a coil 102 and capacitors CM_P, CM_M, CT. Capacitor CT in combination with inductance of coil 102 creates a parallel resonant circuit 303. Capacitor CM_P and CM_M provide a matching network that transforms the impedance of parallel resonant circuit 303 to the passive differential impedance $R_T$ at the excitation frequency at the output of the PA. The PA 300 is implemented as a discrete chip or a part of a larger application specific integrated circuit (ASIC) including a pair of pre-drivers 304, 306, each coupled to output driver P-type and N-type MOSFET devices 308, 310, which are connected in series with an on-chip resistor 312 having a resistance $R_D$ and function as the PA circuit. The pre-drivers 304, 306 receive, respectively, the pulse sequence, its inverse and the carrier signal, and include logical NAND and NOR gates. In a typical switched-mode power amplifier, the sizes of the PMOS device 308 and NMOS device 310 are chosen to produce a desired PA output power for operation at a target frequency. A fundamental tradeoff exists between the amount of power provided by such PA and its bandwidth due to the parasitic capacitances of devices 308, 310, which reduce the PA bandwidth as their sizes are increased to boost output PA power and vice versa.

In CMOS manufacturing process, ON resistances ($R_{ON}$)—i.e., the resistance across the drain/source path of the MOSFET with the gate terminal configured to operate the MOSFET in a strong inversion linear regime—is a function of many parameters, such as supply voltage, operating temperature, variations in manufacturing parameters including lithography, chemical etching, and electron mobility (among others). As a result, a switching-mode power amplifier using MOSFET devices 308, 310 as switches in the in configuration shown in FIG. 3A will exhibit a large variation of up to 30% in both output power and bandwidth due to variation in the MOSFET ON resistance from one instance of circuit 300 to another and over the full range of environmental conditions. To minimize this variation a calibration approach, as further described below, is utilized to adjust the ON resistance of the PMOS device 308 and NMOS device 310 and keep it at a constant value suited to the particular application.

Because the devices 308, 310 are each connected in series with the resistor 312, the target ON resistance of devices 308, 310 is $R_{ON}\Omega$ so as to provide a combined differential PA output impedance of $R_T=2\times(R_{ON}+R_D)$. In a typical NMR instrument, NMR probe 302 presents a passive 50Ω load to the PA that is expected to have an output impedance of the same value. This promotes optimal power delivery from the PA to probe 302 and avoids electrical reflections that can damage the PA. Without loss of generality, other interface impedance values can be chosen; for example, smaller interface impedance values will result in larger power delivery by the PA. In this case, the value of resistor 312 is reduced and the values of matching capacitors CM_P, CM_M are adjusted appropriately to satisfy the power-matching condition and the lower interface impedance.

Figure 3B:
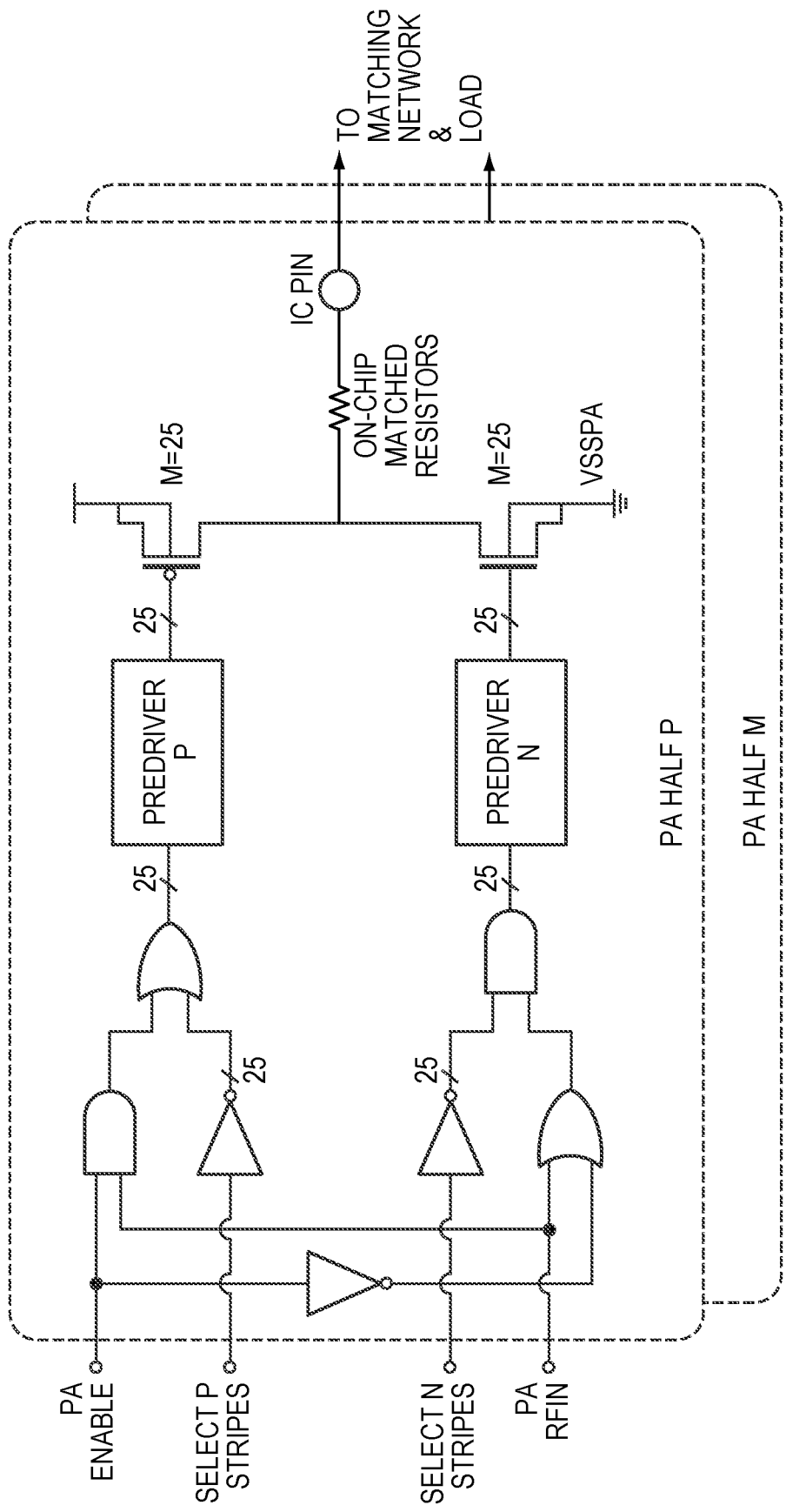
FIG. 3B schematically illustrates an exemplary circuit for adjusting ON resistance.

FIG. 3B illustrates a circuit for adjusting the ON resistance by changing the total width of the output MOSFET devices 308, 310 driving the output of the PA. In one embodiment, PA output devices are configured as a parallel connection of plurality of MOSFET devices ("stripes") each having a width equal to the total desired width of the MOSFET device divided by the chosen number of parallel devices. Without loss of generality, in the embodiment shown in FIG. 3B, the number of parallel MOSFET devices is indicated as NSTRIPES. In some embodiments, the number of stripes in PMOSFET devices can differ from the number of stripes in NMOSFET devices to accommodate different variabilities of P-type and N-type MOSFETs. Unlike the conventional class-D PA illustrated in FIG. 3A, the gate terminals of the output MOSFETS shown in FIG. 3B can be individually controlled using the illustrated stripe-selection logic circuits 320, 322. In particular, the desired number of stripes is selected by driving HI the appropriate number of bits in the digital control signals SELECT_P_STRIPES and SELECT_N_STRIPES, which are digital signals of width NSTRIPES bits. The value of NSTRIPES is chosen in such that when all stripes of the output MOSFET device are selected, the ON resistance of the MOSFET device is less than the target RON value for the worst-case manufacturing variation, resulting in lowest ON resistance of the typical MOSFET in the chosen manufacturing process, lowest desired operating temperature and highest operating power supply voltage.

The resistance $R_D$ of the on-chip resistors 312 typically does not depend significantly on temperature and voltage, but may vary in a range of ±15% as a result of the manufacturing process variations. Thus, total single-ended output impedance of the PA, $R_{ON}+R_D$, may vary in the range of ±30%; this necessitates a calibration approach to provide stable PA output power levels to ensure consistency and repeatability during NMR measurements.

Figure 4:
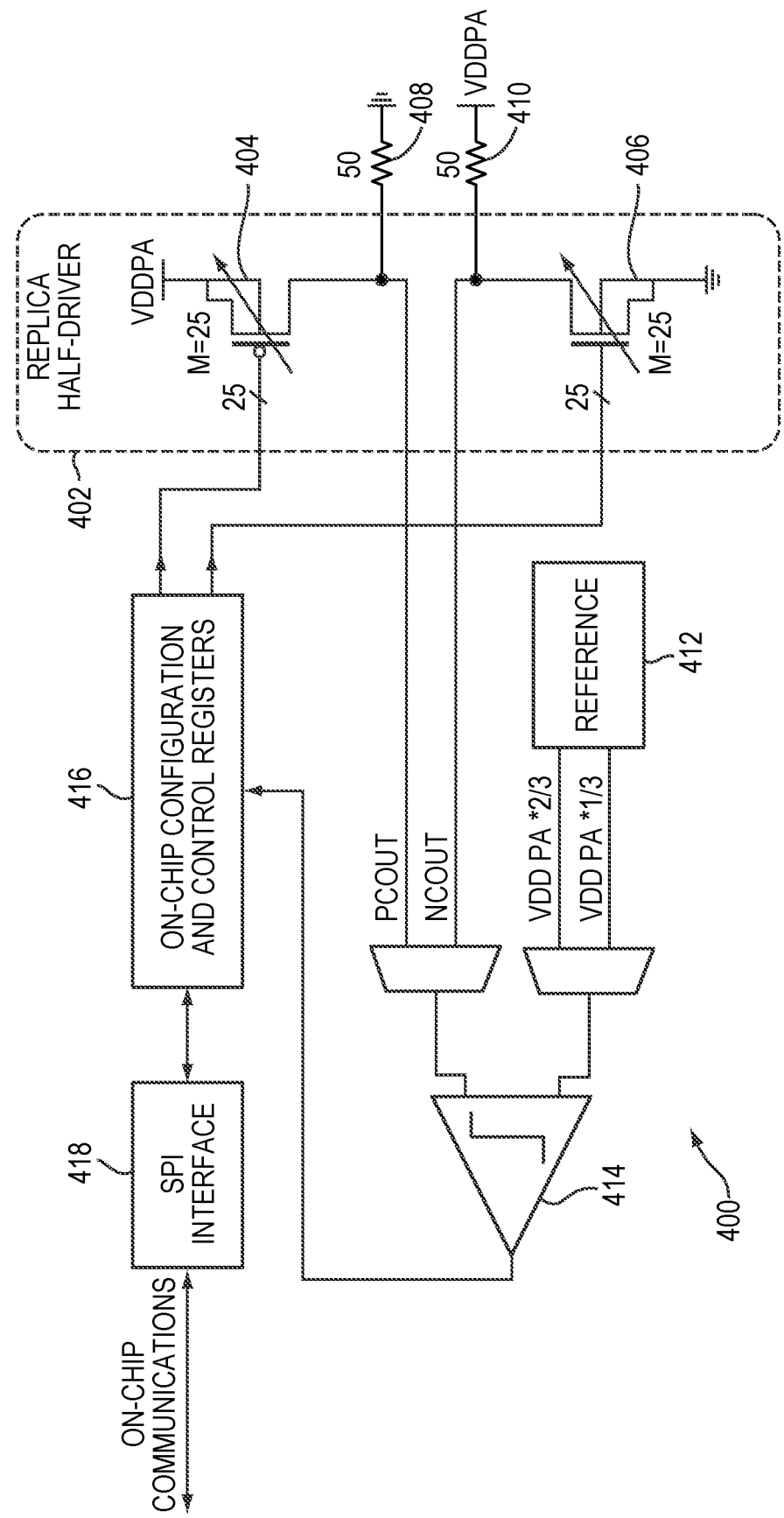
FIG. 4 schematically illustrates a calibration circuit in accordance with various embodiments of the present invention.

FIG. 4 illustrates a calibration circuit 400 in accordance with various embodiments of the present invention. The calibration circuit 400 utilizes sensors integrated on the same chip as the PA circuit 300 to accurately measure a DC ON resistance of the switch MOSFET devices of the PA. In various embodiments, the ON resistance is measured using a PA driver replica circuit 402 having PMOSFET and NMOSFET switches 404, 406 with on-chip resistors $R_D$ and loaded with external resistors 408, 410, respectively; each of the resistors 408, 410 has an impedance of $R_{CAL}$ precisely. Devices 404, 406 have identical total width and length and have the same number of stripes (NSTRIPES) as devices 308, 310 shown in FIG. 3B. In various embodiments, the calibration approach implements an on-chip voltage reference 412 for generating a reference voltage and a comparator 414 for comparing the reference voltage with the output voltage of the sense PMOSFET or NMOSFET 404, 406 generated by a resistive divider from $V_{DDPA}$ to $V_{SSPA}$. The resistive dividers may be formed by the resistors 408, 410, which have a precise impedance of $R_{CAL}$, resistors $R_D$ connected in series with the drain terminal of the PMOSFET and NMOSFET sensors of the calibration circuit, and the ON resistance of the MOSFET devices 404, 406.

In various embodiments, a decision value of the comparator 414 is stored in one of a bank of control registers 416, which are accessible to a digital interface 418. (All of these components may reside on the ASIC 300 shown in FIG. 3B.) In addition, a finite state machine may be utilized to adjust the corresponding ON resistance of the replica half driver 402 until the output voltage of the sense PMOSFET or NMOSFET crosses a threshold voltage corresponding to a target value of the ON resistance. For the PMOSFET sensor circuit, the comparator threshold voltage is chosen to be $(2/3) \times V_{DDPA}$ where $V_{DDPA}$ is the PA supply voltage. For the NMOSFET sensor circuit, comparator threshold voltage is chosen to be $(1/3) \times V_{DDPA}$. The finite state machine may be implemented on or outside the chip 300 in hardware and/or software. In some embodiments, the threshold voltages can be generated internally on the chip using the resistive divider string formed by three identical resistors connected in series from $V_{DDPA}$ to $V_{SSPA}$. Given the generated threshold voltages, the comparator output will change when the following condition is met for either one of the MOSFET sensors: $R_{ON} + R_D = (R_{CAL}/2)$.

In various embodiments, the PA half-replica impedance sensor 402 is controlled by two control registers (e.g., CENSN and CENSP in a Model WG1000 provided by WaveGuide Corporation). Writing logic 1 to either one of these registers may enable one or both sense devices 404, 406. In addition, two registers (e.g., CDSN and CDSP) may be used to drive the gates of the MOS sensor devices 404, 406 to an appropriate value required for the calibration approach. In some embodiments, a register (e.g., SELCAL-REF) is used to select which one of the sense PMOSFET and NMOSFET devices and which reference voltages are connected to the inputs of the decision comparator 414. For example, writing logic 0 may select the output from the sense PMOS 404 and $(2/3) \times V_{DDPA}$ reference voltage, whereas writing logic 1 may select the output from the sense NMOS 406 and $(1/3) \times V_{DDPA}$ reference voltage.

Figure 5:
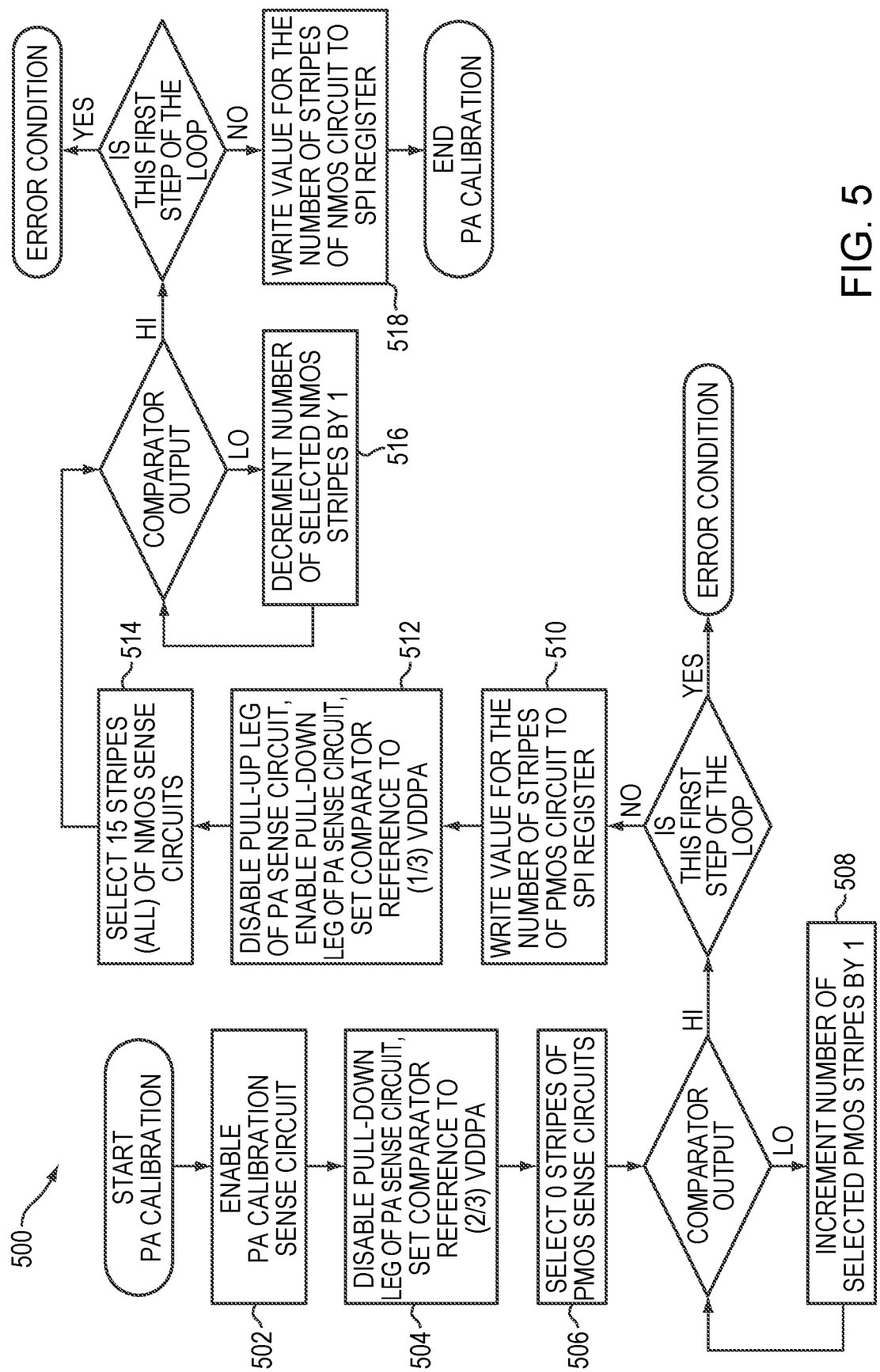
FIG. 5 is a flow chart illustrating a representative approach for calibrating PA output impedance.

FIG. 5 illustrates a representative flow chart 500 illustrating operation of the calibration circuit 400 for calibrating a PA output impedance. In a preferred embodiment, the output impedance of the PA is calibrated, before each NMR experiment, during the so called "recycle delay" or after the chip is powered up. While no specific algorithm update rate is specified for the steps of the flow chart 500, it is expected that a minimal progression time interval in the finite state machine is determined based on the settling time constants of capacitors in a low-pass filter that are used to remove high-frequency noise at the inputs of the decision comparator 414 arising during switching between different comparison thresholds.

With reference to FIGS. 3B, 4 and 5, in a first step 502, the circuit 400 is enabled. The NMOSFET leg 406 of the circuit 400 is disabled and the comparator reference 412 is set to $(2/3) V_{DDPA}$ reference voltage (step 504). At this point, no stripes of the PMOSFET sense circuit 404 are selected (step 506). If the output of the comparator 414 is low, additional stripe is enabled in the PMOSFET sense circuit 404 (step 508). If the output of the comparator 414 is high and the procedure 500 has just been entered, an error condition exists where either target $R_{ON}$ value of the PMOSFET device is too large and cannot be achieved by selecting even single stripe of the calibration sensor PMOSFET 404 or comparator threshold value was chosen incorrectly for the target $R_{ON}$ value; otherwise, the current number of stripes is written the register bank 416 (step 510). At this point the PMOSFET leg 404 of the circuit 400 is disabled and the NMOSFET leg 406 is enabled, and the comparator reference 412 is set to $(1/3) \times V_{DDPA}$ reference voltage (step 512). All 15 stripes of the NMOS sense circuit are selected (step 514). If the output of the comparator 414 is now low, the number of stripes selected for the NMOS sense circuit is progressively decremented until the comparator output is high (step 516). Once again, if the comparator output is high and the procedure 500 has just been entered, an error condition exists where either target $R_{ON}$ value of the NMOSFET device is too small (i.e., cannot be achieved by selecting all stripes of the calibration sense NMOSFET 406) or the comparator threshold value was chosen incorrectly for the target $R_{ON}$ value; otherwise, the current number of stripes is written the register bank 416 (step 518) and the procedure ends. The target value of the ON resistances having thus been established and set, the NMR circuit is ready for operation.

The calibration method 500 may be implemented in the controller 110. Controller 110 may be implemented in hardware, software or a combination of the two. For embodiments in which the functions of the controller are provided as one or more software programs, the programs may be written in any of a number of high level languages such as PYTHON, PASCAL, JAVA, C, C++, C#, BASIC, various scripting languages, and/or HTML. Additionally, the software can be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM. Embodiments using hardware circuitry may be implemented using, for example, one or more FPGA, CPLD or ASIC processors. Controller 110 may be implemented in hardware, software or a combination of the two. For embodiments in which the functions are provided as one or more software programs, the programs may be written in any of a number of high level languages such as PYTHON, PASCAL, JAVA, C, C++, C#, BASIC, various scripting languages, and/or HTML. Additionally, the software can be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM. Embodiments using hardware circuitry may be implemented using, for example, one or more FPGA, CPLD or ASIC processors.

Approaches described herein may be particularly suitable for implementation in a low-field NMR system where multiple transceivers are integrated on the same semiconductor substrate such that multiple simultaneous NMR measurements can be performed at once. A single replica half circuit described above may be used to independently calibrate all on-chip PAs without the need for providing numerous external resistors to match the impedance of each individual PA.

In addition, approaches described herein may be suitable for implementation in a low-field NMR system where an NMR coil is integrated on the same silicon substrate as the NMR transceiver, or on a separate silicon substrate but is encapsulated in the same package. In this situation, the calibration techniques described herein may provide precise and robust power delivery to the NMR coil without directly accessing and configuring the interface between the PA and NMR coil.

An additional benefit is that this technique may also allow class-D PAs to be used with NMR probes having a significantly lower impedance. The ability to precisely control the output impedance at lower absolute impedance values is important because the same absolute variations of PA output impedance may result in larger relative variations of the delivered output power. In micro-NMR, it is desirable to shift from a 50Ω system to a lower-impedance system so as to increase the total available PA and delivered power for the same supply voltage $V_{DDPA}$.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. Circuitry for reducing variability of an output impedance of an integrated switch-mode power amplifier (PA), the circuitry comprising:
   a PA driver comprising one or more PMOS components and one or more NMOS components;
   a pre-driver for facilitating activation and deactivation of the PA driver;
   a passive resistor coupled to the PA driver so as to split the output impedance between the PA driver and the passive resistor; and
   a calibration circuit comprising a replica circuit of the PA driver and a load resistor for calibrating an ON resistance of the PA driver so as to provide stable output power levels, the replica circuit comprising one or more PMOS components and one or more NMOS components identical to the components of the PA driver.

2. The circuitry of claim 1, wherein the passive resistor has an impedance that does not depend on temperature or voltage.

3. The circuitry of claim 1, wherein the calibration circuit further comprises an on-chip voltage divider for generating a reference voltage.

4. The circuitry of claim 3, wherein the calibration circuit further comprises a comparator for comparing the reference voltage with an output voltage of the replica circuit and the load resistor.

5. The circuitry of claim 1, wherein the passive resistor is on-chip.

6. The circuitry of claim 1, wherein the passive resistor is off-chip.

7. The circuitry of claim 1, wherein the calibration circuit is configured to adjust the ON resistance of the replica circuit until an output voltage of the replica circuit crosses a threshold voltage corresponding to a target value of the ON resistance of the replica circuit.

8. The circuitry of claim 7, wherein the target value of the ON resistance of the replica circuit satisfies an equation:

$$R_{ON}+R_D=R_{CAL}/2$$

where $R_{ON}$ denotes the target value of the ON resistance of the replica circuit, $R_D$ denotes a resistance of the passive resistor, and $R_{CAL}$ denotes a resistance of the load resistor.

9. An NMR apparatus comprising:
   an NMR coil configured to enclose a sample;
   an integrated switch-mode PA coupled to the NMR coil; and
   circuitry for reducing variability of an output impedance of the PA;
   wherein the circuitry comprises (i) a PA driver comprising one or more PMOS components and one or more NMOS components, (ii) a pre-driver for facilitating activation and deactivation of the PA driver, (iii) a passive resistor coupled to the PA driver for splitting the output impedance between the PA driver and the passive resistor, and (iv) a calibration circuit comprising a replica circuit of the PA driver and a load resistor for calibrating an ON resistance of the PA driver so as to provide stable output power levels, the replica circuit comprising one or more PMOS components and one or more NMOS components identical to the components of the PA driver.

10. The NMR apparatus of claim 9, wherein the passive resistor has an impedance that does not depend on temperature or voltage.

11. The NMR apparatus of claim 9, wherein the calibration circuit further comprises an on-chip voltage divider for generating a reference voltage.

12. The NMR apparatus of claim 11, wherein the calibration circuit further comprises a comparator for comparing the reference voltage with an output voltage of the replica circuit and the load resistor.

13. The NMR apparatus of claim 9, wherein the calibration circuit is configured to adjust the ON resistance of the replica circuit until an output voltage of the replica circuit crosses a threshold voltage corresponding to a target value of the ON resistance of the replica circuit.

14. The NMR apparatus of claim 13, wherein the target value of the ON resistance of the replica circuit satisfies an equation:

$$R_{ON}+R_D=R_{CAL}/2$$

where $R_{ON}$ denotes the target value of the ON resistance of the replica circuit, $R_D$ denotes a resistance of the passive resistor, and $R_{CAL}$ denotes a resistance of the load resistor.

15. A method of reducing variability of an output impedance of an integrated switch-mode power amplifier (PA), the method comprising:
   providing a PA driver having one or more PMOS components and one or more NMOS components;
   providing a pre-driver for facilitating activation and deactivation of the PA driver;
   providing a calibration circuit comprising a replica circuit of the PA driver and a load resistor for calibrating an ON resistance of the PA driver, the replica circuit comprising one or more PMOS components and one or more NMOS components identical to the components of the PA driver;
   adjusting a first number of stripes of the replica circuit such that the ON resistance thereof has a desired impedance; and
   adjusting a second number of stripes of the PA driver based at least in part on the adjusted first number of stripes to provide the desired impedance.

16. The method of claim 15, wherein the first number of stripes of the replica circuit is adjusted until an output voltage of the replica circuit crosses a threshold voltage corresponding to a target value of the ON resistance of the replica circuit.

17. The method of claim 16, wherein the target value of the ON resistance of the replica circuit satisfies an equation:

$$R_{ON}+R_D=R_{CAL}/2$$

where $R_{ON}$ denotes the target value of the ON resistance of the replica circuit, $R_D$ denotes a resistance of the passive resistor, and $R_{CAL}$ denotes a resistance of the load resistor.

* * * * *